(12) United States Patent
Boyle et al.

(10) Patent No.: US 7,669,151 B1
(45) Date of Patent: Feb. 23, 2010

(54) METHODS FOR REDUCING POWER SUPPLY SIMULTANEOUS SWITCHING NOISE

(75) Inventors: Peter Boyle, Mountain View, CA (US); Iliya G. Zamek, San Jose, CA (US); Zhe Li, Sunnyvale, CA (US); Lawrence David Smith, San Jose, CA (US)

(73) Assignee: Altera Corporation, San Jose, CA (US)

( * ) Notice: Subject to any disclaimer, the term of this patent is extended or adjusted under 35 U.S.C. 154(b) by 390 days.

(21) Appl. No.: 11/715,593

(22) Filed: Mar. 7, 2007

(51) Int. Cl.
*G06F 17/50* (2006.01)
*G06F 19/00* (2006.01)

(52) U.S. Cl. ............... 716/2; 716/6; 716/7; 703/16
(58) Field of Classification Search ............ 716/2, 716/6, 7; 703/16
See application file for complete search history.

(56) References Cited

U.S. PATENT DOCUMENTS

| 6,075,932 A * | 6/2000 | Khouja et al. .............. 716/4 |
| 6,195,630 B1 * | 2/2001 | Mauskar et al. ............ 703/18 |
| 6,385,565 B1 | 5/2002 | Anderson et al. |
| 6,601,221 B1 * | 7/2003 | Fairbanks ................... 716/5 |
| 6,870,436 B2 | 3/2005 | Grebenkemper |
| 7,019,560 B2 | 3/2006 | Wimmer et al. |
| 7,107,477 B1 | 9/2006 | Singh et al. |
| 7,110,420 B2 | 9/2006 | Bashirullah et al. |
| 7,257,788 B2 * | 8/2007 | Haar et al. .................. 716/6 |
| 2003/0182645 A1 * | 9/2003 | Fairbanks ................... 716/5 |
| 2006/0101362 A1 * | 5/2006 | Haar et al. .................. 716/6 |
| 2007/0220468 A1 * | 9/2007 | Haar et al. .................. 716/6 |

OTHER PUBLICATIONS

U.S. Appl. No. 11/222,588, filed Sep. 9, 2005, Patel.

* cited by examiner

*Primary Examiner*—Phallaka Kik
(74) *Attorney, Agent, or Firm*—Treyz Law Group; G. Victor Treyz

(57) ABSTRACT

Computer-aided design tools analyze a custom logic design for a programmable logic device integrated circuit. The tools identify distinct clock domains in the design. The tools also identify which of the clock domains are synchronous. The tools examine the synchronous clock domains to determine which of the clock domains have required fixed phase relationships. Clocks for clock domains that do not have required fixed relationships can be adjusted in phase to minimize power supply simultaneous switching noise. Noise may be minimized by making clock phase adjustments using a programmable phase-locked loop circuit.

20 Claims, 11 Drawing Sheets

METHODS FOR REDUCING POWER SUPPLY SIMULTANEOUS SWITCHING NOISE

BACKGROUND

This invention relates to integrated circuits such as programmable logic device integrated circuits, and more particularly, to reducing simultaneous switching noise in power supply signals on such integrated circuits.

Programmable logic devices are a type of integrated circuit that can be programmed by a user to implement a desired custom logic function. In a typical scenario, a logic designer uses computer-aided design tools to design a custom logic circuit. When the design process is complete, the tools generate configuration data files. The configuration data is loaded into memory elements on the programmable logic devices to configure the devices to perform the desired custom logic function.

The performance of modern integrated circuits such as programmable logic devices can be adversely affected by power supply noise. Power supply noise may be generated when multiple circuits are switched simultaneously. This type of power supply noise is sometimes referred to as power supply simultaneous switching noise. Power supply simultaneous switching noise arises when multiple circuits draw current in unison, creating current spikes on the power supply lines. If power supply simultaneous switching noise becomes too large, circuit functions on a programmable logic device may be disrupted.

It would therefore be desirable to be able to provide ways in which to minimize power supply simultaneous switching noise on integrated circuits such as programmable logic device integrated circuits.

SUMMARY

In accordance with the present invention, integrated circuits such as programmable logic devices are provided that are designed using computer-aided design tools. A logic designer provides the computer-aided design tools with a custom logic design that is to be implemented in a given programmable logic device integrated circuit.

The computer-aided design tools analyze the custom design to identify distinct clock domains. The tools examine the distinct clock domains that have been identified to determine whether any of the clock domains are synchronous. In a typical scenario, the tools identify multiple groups of synchronous clock domains.

For each group of synchronous clock domains, the computer-aided design tools determine whether any of the clock domains have required fixed phase relationships. For those clock domains that do not have required fixed phase relationships, the phases of the clocks associated with the clock domains can be adjusted by the computer-aided design tools to minimize power supply simultaneous switching noise.

Further features of the invention, its nature and various advantages will be more apparent from the accompanying drawings and the following detailed description of the preferred embodiments.

DETAILED DESCRIPTION

The present invention relates to integrated circuits such as programmable logic device integrated circuits with blocks of circuitry that are organized into various clock domains each having a respective clock. By adjusting clock circuitry on the integrated circuits, the phases of clocks for the various clock domains can be configured to reduce simultaneous circuit switching and thereby reduce power supply simultaneous switching noise. The clock circuitry that is adjusted may be phase-locked loop circuitry, delay-locked-loop circuitry, circuitry based on delay chains or other such circuitry, etc. The integrated circuits may be memory chips with adjustable clock circuitry, digital signal processing circuits with adjustable clock circuitry, microprocessors with adjustable clock circuitry, application specific integrated circuits with adjustable clock circuitry, programmable logic device integrated circuits with adjustable clock circuitry, or any other suitable integrated circuit. The present invention will generally be described in the context of programmable integrated circuits such as programmable logic device integrated circuits as an example. The present invention will also sometimes be described in connection with clock phase adjustment circuitry that is based on a phase-locked loop. This is merely illustrative. Any suitable clock phase adjustment circuitry may be used if desired (e.g., phase-locked loop circuitry, delay-locked-loop circuitry, circuitry based on delay chains or other such circuitry, etc.).

Figure 1:
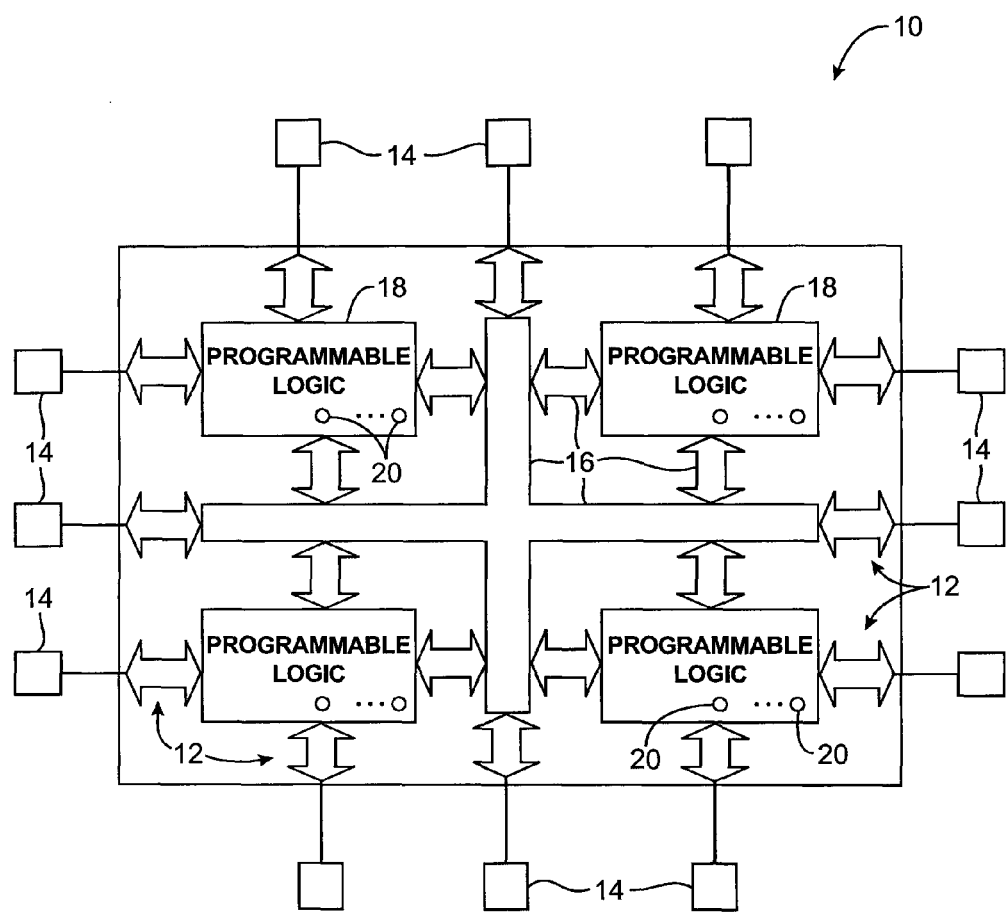
FIG. 1 is a diagram of an illustrative programmable logic device in accordance with an embodiment of the present invention.

An illustrative programmable logic device 10 in accordance with the present invention is shown in FIG. 1. Programmable logic device 10 may have input/output circuitry 12 for driving signals off of device 10 and for receiving signals from other devices via input/output pins 14. Interconnection resources 16 such as global and local vertical and horizontal conductive lines and busses may be used to route signals on device 10. Interconnection resources 16 include fixed interconnects (conductive lines) and programmable interconnects (i.e., programmable connections between respective fixed interconnects). Programmable logic 18 may include combinational and sequential logic circuitry. The programmable logic 18 may be configured to perform a custom logic function. The programmable interconnects associated with interconnection resources may be considered to be a part of programmable logic 18.

Programmable logic device 10 contains programmable elements 20. Programmable elements 20 may be based on any suitable technology. For example, programmable elements may be formed from mask-programmable via structures on device 10. With this type of arrangement, the programmable logic of device 10 is configured using custom lithographic masks during fabrication. As another example, programmable elements 20 may be formed from volatile memory elements. Programmable elements 20 can also be formed from nonvolatile memory elements such as fuses, antifuses, electrically-programmable read-only memory elements, etc. With one suitable arrangement, which is sometimes described herein as an example, programmable elements 20 are formed from random-access memory (RAM) cells.

Memory elements 20 such as RAM-based memory cells may be loaded with configuration data (also called programming data) using pins 14 and input/output circuitry 12. Once loaded, the memory elements each provide a corresponding static control output signal that controls the state of an associated logic component in programmable logic 18. The memory element output signals are typically applied to the gates of metal-oxide-semiconductor (MOS) transistors. These transistors may include n-channel metal-oxide-semiconductor (NMOS) pass transistors in programmable components such as multiplexers and logic array blocks (LABs) and p-channel metal-oxide-semiconductor transistors.

The memory element output signals turn the transistors to which they are connected on and off and thereby configure programmable logic 18 to perform its desired logic function. When a memory element supplies a high output to an NMOS pass transistor (as an example), the transistor is turned on and passes logic signals from its input to its output. When the memory element output is low, the pass transistor is turned off and does not pass logic signals. Being able to configure pass transistors in this way allows the logic of the programmable logic device to be programmed to implement a desired logic design.

Because memory elements 20 store configuration data, the memory elements are sometimes referred to as configuration random-access-memory (CRAM) cells. Other terms that are sometimes used to refer to memory elements 20 include terms such as memory cells, static random-access-memory elements or cells, RAM cells, RAM elements, CRAM cells, configuration elements, volatile memory elements, configuration bits, etc. In a typical modern programmable logic device, there may be millions of memory elements 20 on each chip.

The circuitry of device 10 may be organized using any suitable architecture. As an example, the logic of programmable logic device 10 may be organized in a series of rows and columns of larger programmable logic regions each of which contains multiple smaller logic regions. The logic resources of device 10 may be interconnected by interconnection resources 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Still other device arrangements may use logic that is not arranged in rows and columns.

Figure 2:
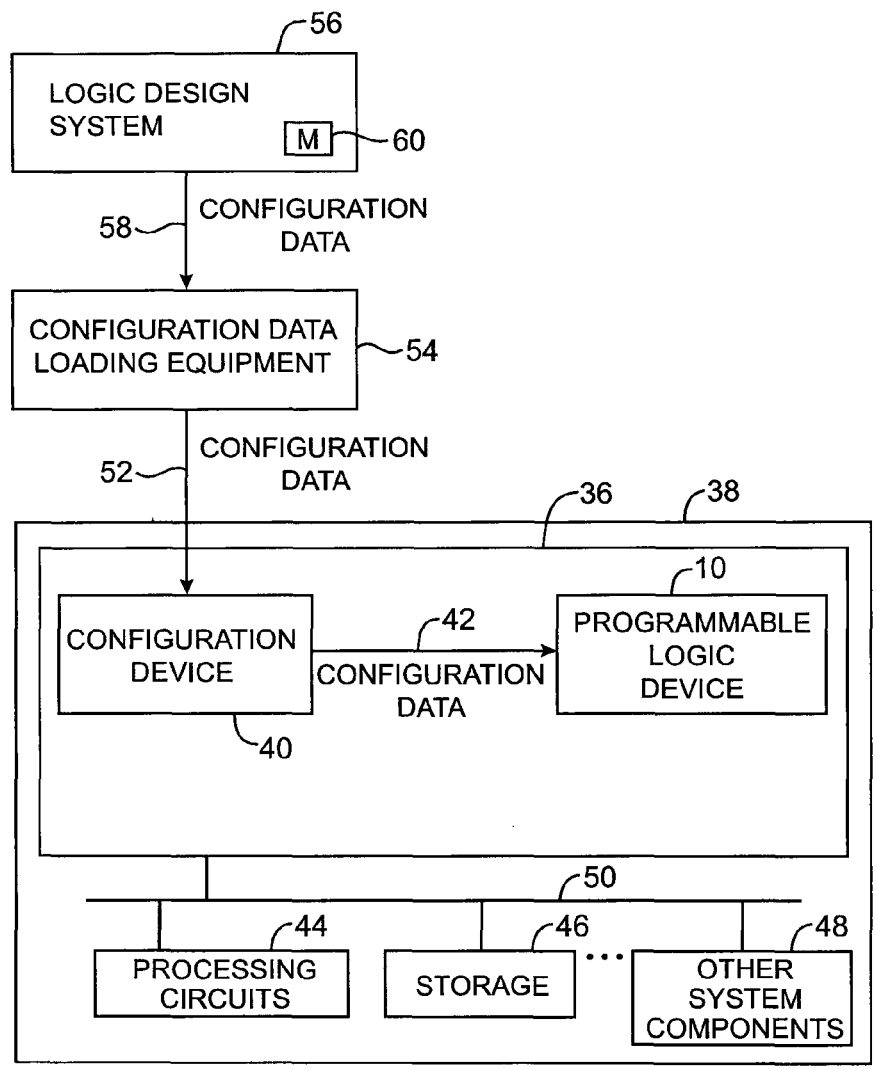
FIG. 2 is a diagram showing how programmable logic device configuration data is created by a logic design system and loaded into a programmable logic device to configure the device for operation in a system in accordance with an embodiment of the present invention.

An illustrative system environment for a programmable logic device 10 is shown in FIG. 2. Programmable logic device 10 may be mounted on a board 36 in a system 38. In general, programmable logic device 10 may receive programming data from programming equipment or from any other suitable equipment or device. In the example of FIG. 2, programmable logic device 10 is the type of programmable logic device that receives configuration data from an associated integrated circuit 40. With this type of arrangement, circuit 40 may, if desired, be mounted on the same board 36 as programmable logic device 10. The circuit 40 may be an erasable-programmable read-only memory (EPROM) chip, a programmable logic device configuration data loading chip with built-in memory (sometimes referred to as a configuration device), or any other suitable device. When system 38 boots up (or at another suitable time), the configuration data for configuring the programmable logic device may be supplied to the programmable logic device from device 40, as shown schematically by path 42. The configuration data that is supplied to the programmable logic device may be stored in the programmable logic device in its configuration random-access-memory elements 20.

System 38 may include processing circuits 44, storage 46, and other system components 48 that communicate with device 10. The components of system 38 may be located on one or more boards such as board 36 or other suitable mounting structures or housings and may be interconnected by buses and other electrical paths 50.

Configuration device 40 may be supplied with the configuration data for device 10 over a path such as path 52. Configuration device 40 may, for example, receive the configuration data from configuration data loading equipment 54 or other suitable equipment that stores this data in configuration device 40.

It can be a significant undertaking to design and implement a desired logic circuit in a programmable logic device. Logic designers therefore generally use logic design systems based on computer-aided-design (CAD) tools to assist them in designing circuits. A logic design system can help a logic designer design and test complex circuits for a system. When a design is complete, the logic design system may be used to generate configuration data for electrically programming the appropriate programmable logic device.

As shown in FIG. 2, the configuration data produced by a logic design system 56 may be provided to equipment 54 over a path such as path 58. The equipment 54 provides the configuration data to device 40, so that device 40 can later provide this configuration data to the programmable logic device 10 over path 42.

Logic circuit design system 56 includes processing circuitry and storage 60. In supporting design operations involved in implementing a desired custom logic function, the logic design system 56 uses software implemented using circuitry and storage 60 to make circuit resource assignments and placement decisions that minimize power supply simultaneous switching noise.

Figure 3:
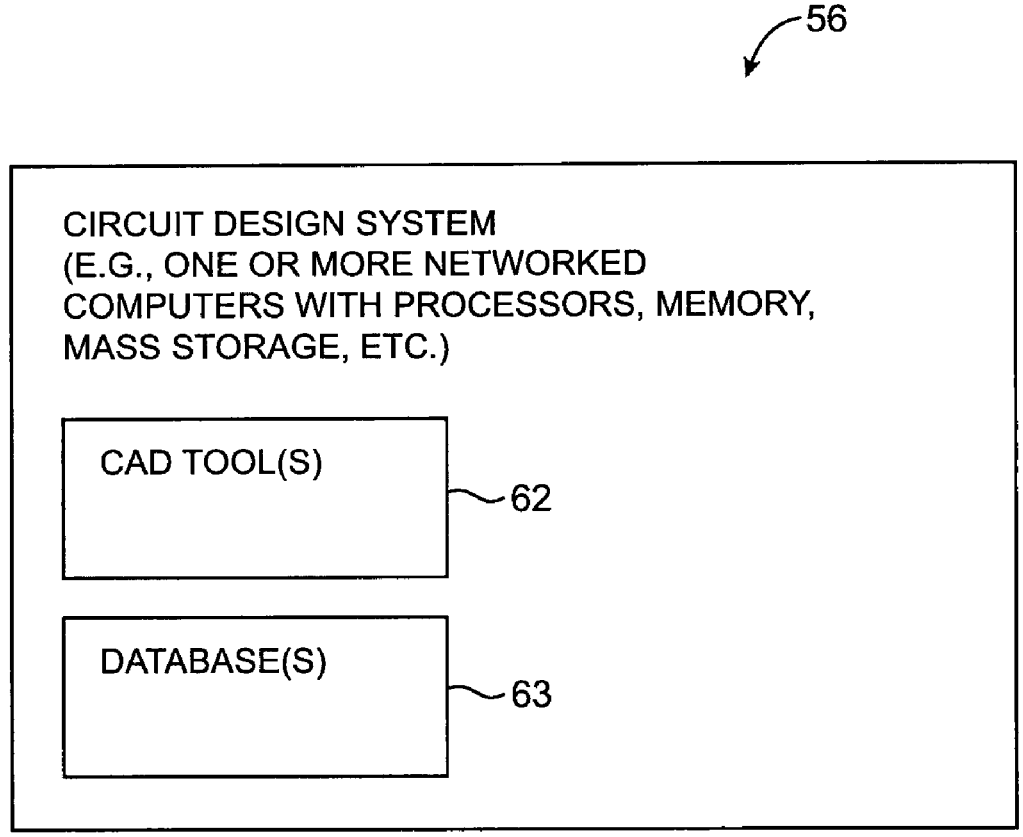
FIG. 3 is a diagram of a circuit design system that may be used to generate configuration data for implementing custom circuit designs in programmable logic devices in accordance with an embodiment of the present invention.

An illustrative circuit design system 56 in accordance with the present invention is shown in FIG. 3. System 56 may be based on one or more processors such as personal computers, workstations, etc. The processor(s) may be linked using a network (e.g., a local or wide area network). Memory in these computers or external memory and storage devices such as internal and/or external hard disks may be used to store instructions and data.

Software-based components such as computer-aided design tools 62 and databases 63 reside on system 56. During operation, executable software such as the software of computer aided design tools 62 runs on the processor(s) of system 56. Databases 63 are used to store data for the operation of system 56. In general, software and data may be stored on any computer-readable medium (storage) in system 56. Such storage, which is shown schematically as storage 60 of FIG. 2, may include computer memory chips, removable and fixed media such as hard disk drives, flash memory, compact discs (CDs), DVDs, other optical media, and floppy diskettes, tapes, or any other suitable memory or storage device(s). When the software of system 56 is installed, the storage 60 of system 56 has instructions and data that cause the computing equipment in system 56 to execute various methods (processes). When performing these processes, the computing equipment is configured to implement the functions of the circuit design system.

The computer aided design (CAD) tools 62, some or all of which are sometimes referred to collectively as a CAD tool, may be provided by a single vendor or multiple vendors. Tools 62 may be provided as one or more suites of tools (e.g., a compiler suite for performing tasks associated with implementing a circuit design in a programmable logic device) and/or as one or more separate software components (tools). Database(s) 63 may include one or more databases that are accessed only by a particular tool or tools and may include one or more shared databases.

Shared databases may be accessed by multiple tools. For example, a first tool may store data for a second tool in a shared database. The second tool can access the shared database to retrieve the data stored by the first tool. This allows one tool to pass information to another tool. Tools may also pass information between each other without storing information in a shared database if desired.

When a logic designer uses tools 62 to implement a circuit, the logic designer is faced with a number of potentially challenging design decisions. The designer must balance factors such as cost, size, and performance to create a workable end product. Tradeoffs are involved. For example, a circuit of a given design can be implemented so that it operates quickly, but consumes a large amount of power and on-chip resources or can be implemented so that is operates more slowly, while consuming less power and fewer resources.

In accordance with the present invention, power supply simultaneous switching noise can be minimized by selectively adjusting the phases of clocks that are supplied to different portions of the device. A logic designer can use a tool or tools 62 to make resource selections, placement decisions, and clock circuitry adjustments to minimize power supply simultaneous switching noise while satisfying design constraints such as desired timing margins. For clarity, the power supply simultaneous switching noise minimization functions of the invention are generally described in the context of logic design system 56 and CAD tools 62. In general, any suitable number of software components (e.g., one or more tools) may be used to provide a circuit designer with power supply simultaneous switching noise reduction assistance. These software components may be separate from logic compilers, place-and-route tools and other software in tools 62 or some or all of the software components that provide power consumption reduction assistance functionality may be provided within logic synthesis and optimization tools, a place-and-route tool, etc.

Figure 4:
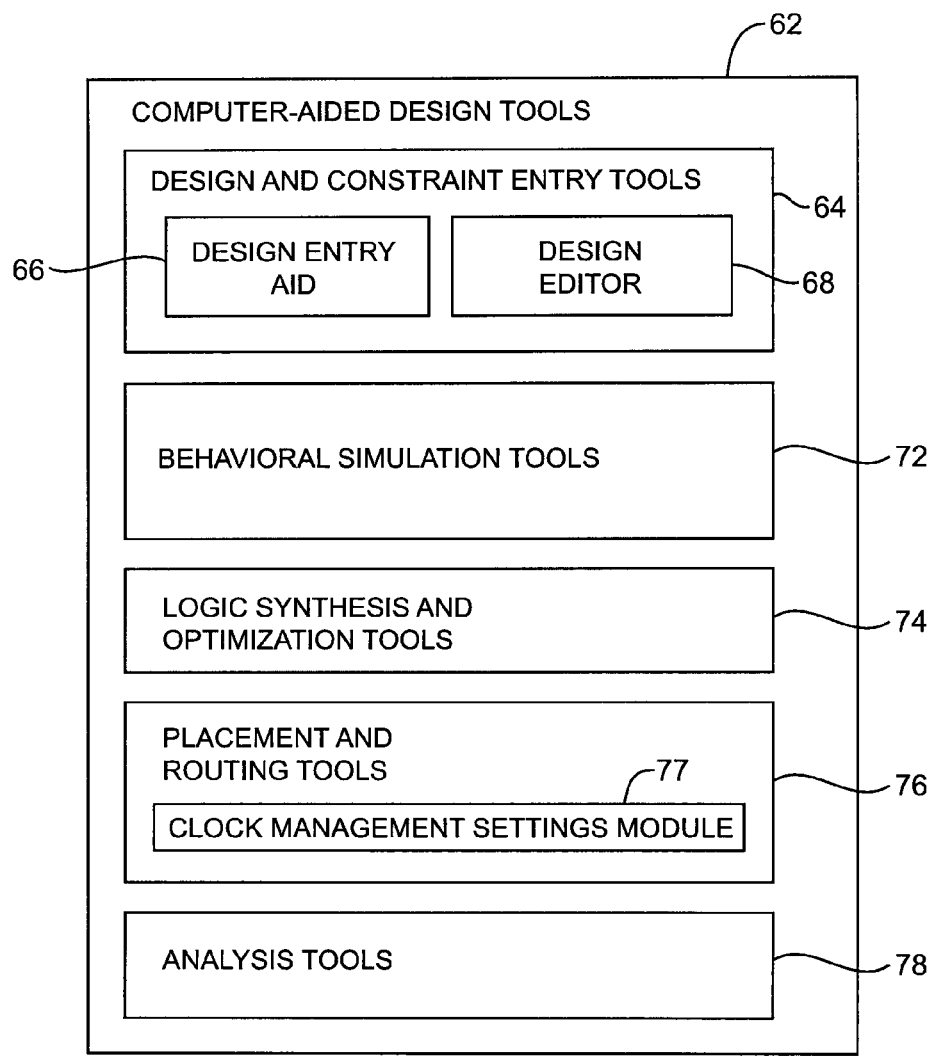
FIG. 4 is a diagram of illustrative computer-aided design (CAD) tools that may be used in a logic design system in accordance with an embodiment of the present invention.

Illustrative computer aided design tools 62 that may be used in a logic design system such as system 56 of FIGS. 2 and 3 are shown in FIG. 4.

The design process typically starts with the formulation of logic circuit functional specifications. A logic designer can specify how a desired circuit should function using design and constraint entry tools 64. Design and constraint entry tools 64 may include tools such as design and constraint entry aid 66 and design editor 68. Design and constraint entry aids such as aid 66 may be used to help a logic designer locate a desired design from a library of existing logic designs and may provide computer-aided assistance to the logic designer for entering (specifying) the desired design. As an example, design and constraint entry aid 66 may be used to present screens of options for a user. The user may click on on-screen options to select whether the circuit being designed should have certain features. Design editor 68 may be used to enter a design (e.g., by entering lines of hardware description language code), may be used to edit a design obtained from a library (e.g., using a design and constraint entry aid), or may assist a user in selecting and editing appropriate prepackaged code/designs.

Design and constraint entry tools 64 may be used to allow a logic designer to provide a desired logic design using any suitable format. For example, design and constraint entry tools 64 may include tools that allow the logic designer to enter a logic design using truth tables. Truth tables can be specified using text files or timing diagrams and may be imported from a library. Truth table logic design and constraint entry may be used for a portion of a large circuit or for an entire circuit.

As another example, design and constraint entry tools 64 may include a schematic capture tool. A schematic capture tool may allow the logic designer to visually construct logic circuits from constituent parts such as logic gates and groups of logic gates. Libraries of preexisting logic circuits may be used to allow a desired portion of a design to be imported with the schematic capture tools.

If desired, design and constraint entry tools 64 may allow the logic designer to provide a logic design to the logic design system 10 using a hardware description language such as Verilog hardware description language (HDL) or Very High Speed Integrated Circuit Hardware Description Language (VHDL). The designer of the logic circuit can enter the logic design by writing hardware description language code with editor 68. Blocks of code may be imported from user-maintained or commercial libraries if desired.

After the design has been entered using design and constraint entry tools 64, behavioral simulation tools 72 may be used to simulate the functional performance of the design. If the functional performance of the design is incomplete or incorrect, the logic designer can make changes to the design using design and constraint entry tools 64. The functional operation of the new design can be verified using behavioral simulation tools 72 before synthesis operations have been performed using tools 74. Simulation tools such as tools 72 may also be used at other stages in the design flow if desired (e.g., after logic synthesis). The output of the behavioral simulation tools 72 may be provided to the logic designer in any suitable format (e.g., truth tables, timing diagrams, etc.).

Once the functional operation of the logic design has been determined to be satisfactory, logic synthesis and optimization tools 74 may be used to implement the logic design in a particular programmable logic device (i.e., in the logic and interconnect resources of a particular programmable logic device product or product family).

Tools 74 attempt to optimize the design by making appropriate selections of hardware to implement different logic functions in the logic design based on the logic design data and constraint data entered by the logic designer using tools 64.

After logic synthesis and optimization using tools 74, the logic design system may use tools such as placement and routing tools 76 to perform physical design steps (layout synthesis operations). Placement and routing tools 76 are used to determine how to place the circuits for each logic function within the programmable logic device. For example, if two counters interact with each other, the placement and routing tools 76 may locate these counters in adjacent logic regions on the programmable logic device to minimize interconnect delays. The placement and routing tools 76 create orderly and efficient implementations of logic designs for a given programmable logic device.

Placement and routing tools may contain one or more modules such as module 77 that are used in making clock settings adjustments. Clock settings adjustments may be made by adjusting delay-locked loops (DLLs), delay lines, delay chains, or other such circuitry. With one suitable arrangement, module 77 is used in making phase-locked loop clock settings adjustments to configure the phase and frequencies of various clocks. The clock settings adjustments that are made using placement and routing tools 76 (e.g., with module 77) may help to reduce simultaneous switching noise on power supply lines by distributing the phases of various clock signals in time. This helps to reduce the amount of circuitry that is switching at a given point in time and therefore reduces power supply simultaneous switching noise.

Tools such as tools 74 and 76 may be part of a compiler suite (e.g., part of a suite of compiler tools provided by a programmable logic device vendor). In accordance with the present invention, tools such as tools 74 and 76 determine which clocks have phases that can be adjusted to reduce power supply simultaneous switching noise while implementing a desired circuit design. This allows tools 74 and 76 to minimize power supply simultaneous switching noise while satisfying design constraints.

After an implementation of the desired logic design in the programmable logic device has been generated using placement and routing tools 76, the implementation of the design may be analyzed and tested using analysis tools 78. After satisfactory optimization operations have been completed using tools 62, tools 62 can produce the configuration data for the programmable logic device.

Figure 5:
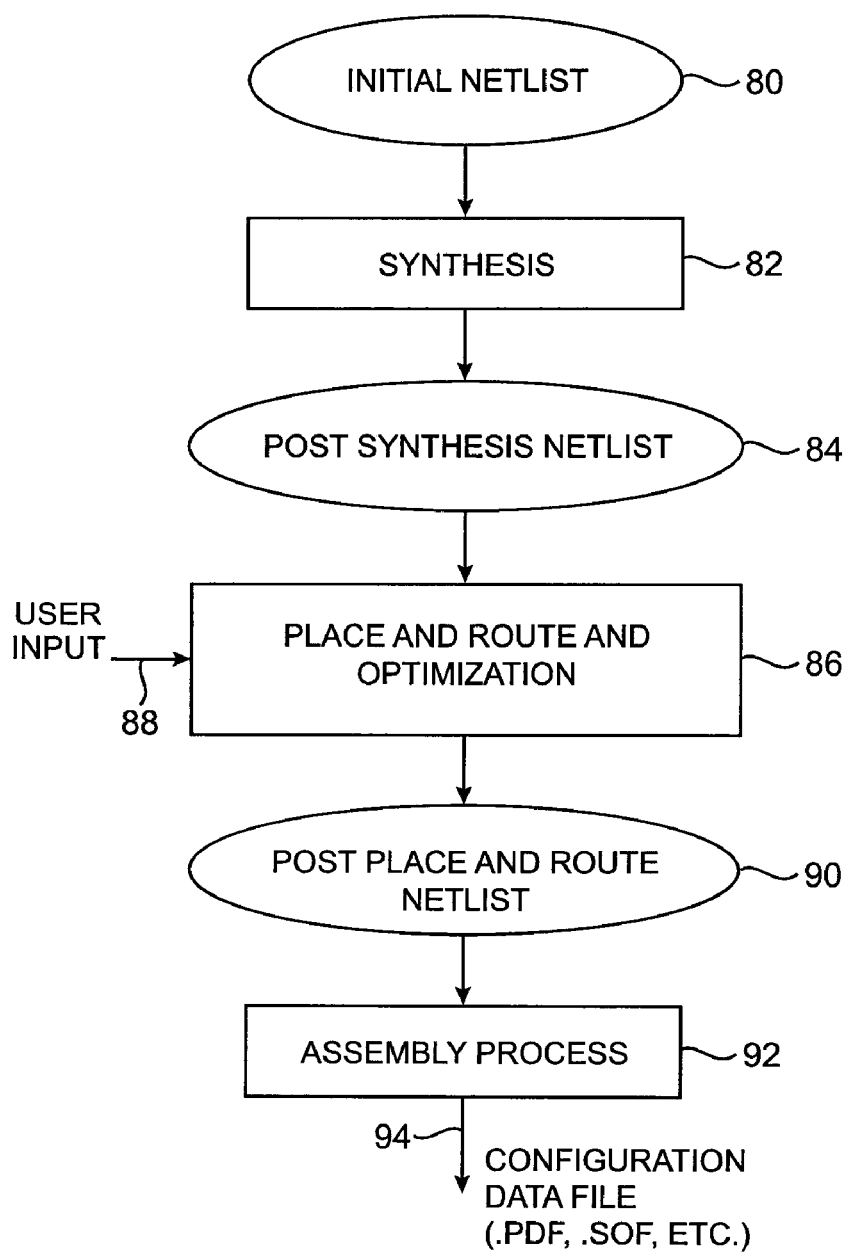
FIG. 5 is a flow chart of illustrative steps involved in designing a custom logic circuit and producing configuration data for that circuit in accordance with an embodiment of the present invention.

Illustrative operations involved in using tools 62 of FIG. 4 to produce configuration data files are shown in FIG. 5. As shown in FIG. 5, an initial netlist 80 is synthesized at step 82 to produce a post-synthesis netlist 84. At step 86, user input 88 and the post synthesis netlist 84 are processed during place and route and optimization operations. During the operations of step 86, the CAD tools 62 determine which clock phases can be adjusted to minimize power supply simultaneous switching noise while satisfying design constraints. The resulting netlist 90 is processed further during an assembly process 92 to produce a configuration data file output 94 (e.g., a .pof or .sof file).

CAD tools 62 can automatically identify clock phase adjustments that can be made to minimize power supply simultaneous switching noise while allowing the logic designer's circuit to function as desired. If desired, manual clock phase settings may also be supplied by the logic designer.

Figure 6:
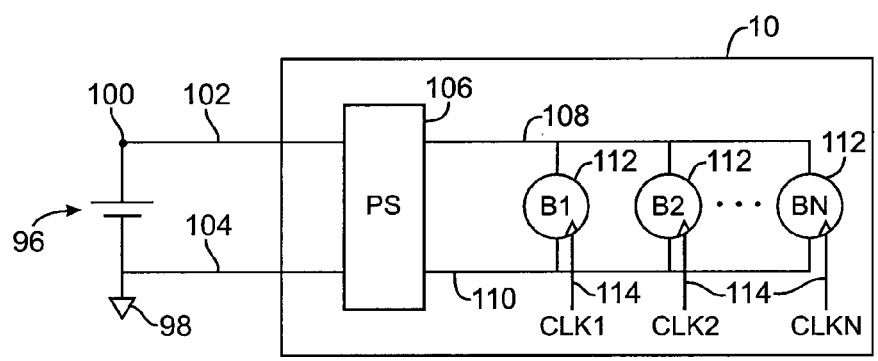
FIG. 6 is a diagram of an integrated circuit showing how multiple blocks of circuitry may share common power supply lines in accordance with an embodiment of the present invention.

Power supply simultaneous switching noise arises when blocks of circuitry share a common clock signal. Consider, as an example, programmable logic device 10 of FIG. 6. In the example of FIG. 6, programmable logic device 10 is powered by an external power source 96. Power supply 96 has a ground terminal 98 and positive power supply terminal 100. Terminals 98 and 100 may be connected to internal power supply circuitry 106 using paths such as positive power supply path 102 and ground power supply path 104. If desired, multiple parallel power distribution paths may be used to provide power to device 10. For example, there may be multiple ground pins and multiple positive power supply pins on a given device 10.

Power supply circuitry 106 may be used to condition the power signals from external power supply 96. For example, power supply circuitry 106 may be used to produce a boosted or reduced power supply voltage relative to the power supply voltage across terminals 100 and 98. Power supply circuitry 106 may also include voltage regulator circuitry that helps to ensure that the power supply voltages for device 10 are stable. Power supply circuitry 106 typically provides a positive power supply signal on positive power supply line 108 and a ground power supply signal on ground power supply line 110. If desired, power supply circuitry 106 may provide different power supply voltages to different on-chip circuitry. For example, power supply circuitry 106 may provide a core logic power supply level to core logic on device 10 and may provide an elevated power supply level to peripheral circuitry on device 10 (i.e., circuitry associated with input-output drivers).

Device 10 has blocks of circuitry 112 (e.g., blocks of core logic) that are powered by the positive and ground voltages on lines 108 and 110. Each block 112 may be clocked by a corresponding clock signal that is received on a respective clock line 114. In the example of FIG. 6, the blocks 112 that are labeled B1, B2, . . . BN receive respective clock signals on the lines 114 that are labeled CLK1, CLK2, . . . CLKN. The circuits that are associated with a given clock signal or a group of related clocks signals are commonly said to belong to a common clock domain. Thus, in the example of FIG. 6, circuit block B1 is associated with a first clock domain (i.e., the clock domain for clock CLK1), circuit block B2 is associated with a second clock domain (i.e., the clock domain for clock CLK2), etc.

Circuit blocks 112 typically contain edge-triggered flip flops and other circuits that draw a significant amount of current on clock edges. Blocks 112 may, for example, contain flip flops and other circuits that triggered on rising clock edges. Blocks 112 might also contain flip flops that are triggered on falling clock edges. For specificity, use of rising-clock-edge triggered flip flops and other rising clock triggered circuitry is described herein as an example.

As a result of the edge-triggered nature of the flip flops and other circuitry in blocks 112, each time a clock signal in a given clock domain has a rising edge, the circuitry in that clock domain exhibits a current spike. Current spikes through circuit blocks 112 cause the power supply voltage across lines 108 and 110 to fluctuate. When multiple clock domains are in phase alignment, the rising edges of each of their clocks is aligned. This leads to larger current spikes than would otherwise be present and therefore leads to correspondingly larger fluctuations in the power supply voltage across lines 108 and 110. The fluctuations on the power supply voltage that arise from simultaneously switched circuitry in circuit blocks 112 are referred to as power supply simultaneous switching noise. By adjusting the phase of the clock signals in clock domains that are not required to have a particular fixed phase relationship, the magnitude of current spikes arising from simultaneous logic switching and therefore power supply simultaneous switching noise can be reduced.

Figure 7:
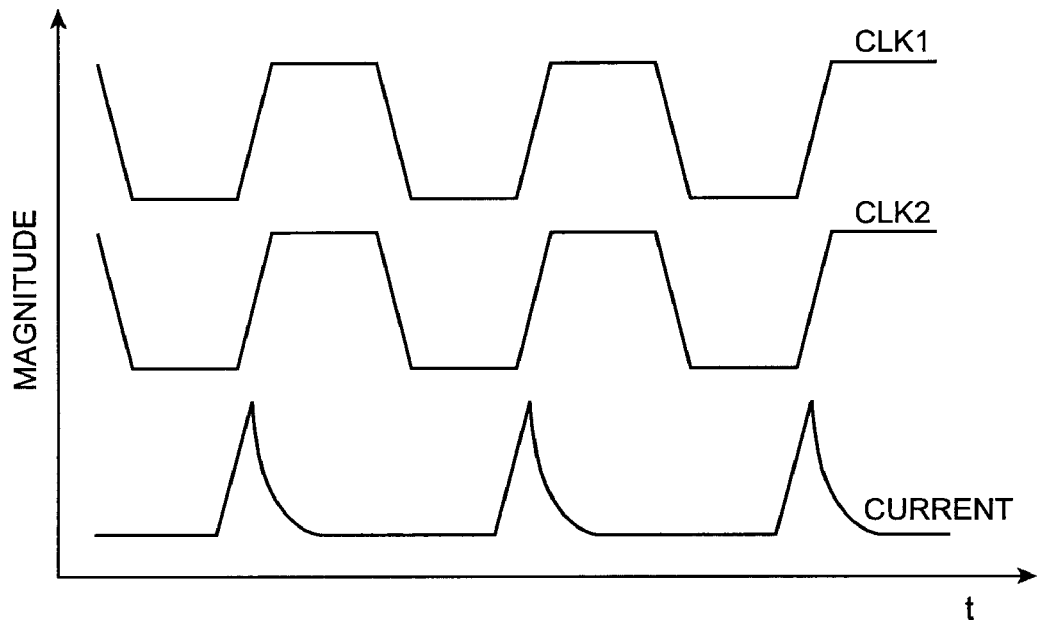
FIG. 7 is a diagram showing how a relatively large amount of power supply simultaneous switching noise may be generated when clocks in multiple clock domains are aligned.
Figure 8:
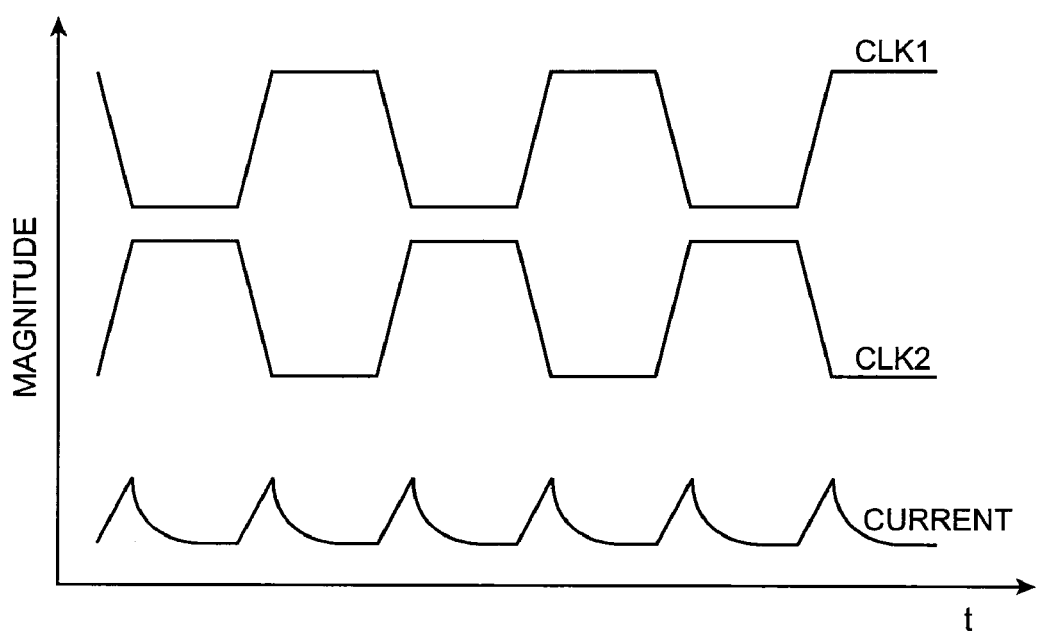
FIG. 8 is a diagram showing how a relatively small amount of power supply simultaneous switching noise may be generated when clocks in multiple clock domains are not aligned in accordance with an embodiment of the present invention.

An example is shown in FIGS. 7 and 8. The graph of FIG. 7 contains three traces. The top two traces represent clock signals CLK1 and CLK2 for two respective clock domains. The bottom trace in FIG. 7 represents the current that is drawn through the circuit blocks (e.g., B1 and B2 in FIG. 6) that are clocked by the clock signals CLK1 and CLK2. Because the rising edges of CLK1 and CLK2 are in phase (i.e., there is a phase angle of 0° between CLK1 and CLK2), the current in the bottom trace of FIG. 7 exhibits relatively large peaks.

In the arrangement of FIG. 8, in contrast, the CLK1 and CLK2 signals have been configured so that CLK2 is 180° out of phase with respect to CLK1. As shown in the bottom trace of FIG. 8, this leads to current peaks of reduced magnitude relative to the current peaks of FIG. 7.

In the example of FIGS. 7 and 8, the frequencies of clocks CLK1 and CLK2 are identical. This is merely illustrative. Reductions in power supply simultaneous switching noise may be obtained by adjusting the phase relationship of clock signals such as CLK1 and CLK2 even in situations in which the frequencies of CLK1 and CLK2 are not equal. This is because even non-identical clocks may exhibit periodic rising edge alignments. For example, if one clock has a frequency that is double that of another clock, there will still be a potential rising clock edge alignment at the frequency of the slower of the two clocks.

The amount of reduction in power supply simultaneous switching noise that can be achieved in a given situation depends on the relative sizes of the frequencies of CLK1 and CLK2. For example, if CLK1 is 2 MHz and CLK2 is 3 MHz, there will be current spikes at a frequency of 0.5 MHz (i.e., whenever a rising edge of CLK1 is aligned with a rising edge of CLK2), provided that CLK1 and CLK2 are in phase. If there is a non-zero phase difference between CLK1 and CLK2, the rising edges of CLK1 and CLK2 will never be exactly aligned, so the magnitude of the current spikes and the power supply simultaneous switching noise will be reduced.

To reduce power supply simultaneous switching noise, CAD tools 62 identify which clock domains on device 10 have clock signals with required fixed phase relationships. The phase between these clocks cannot be adjusted without disturbing the desired functionality of device 10. CAD tools 62 also identify which clock domains do not have fixed phase relationships. The phases of the clocks associated with these clock domains can be adjusted to reduce power supply simultaneous switching noise.

Figure 9:
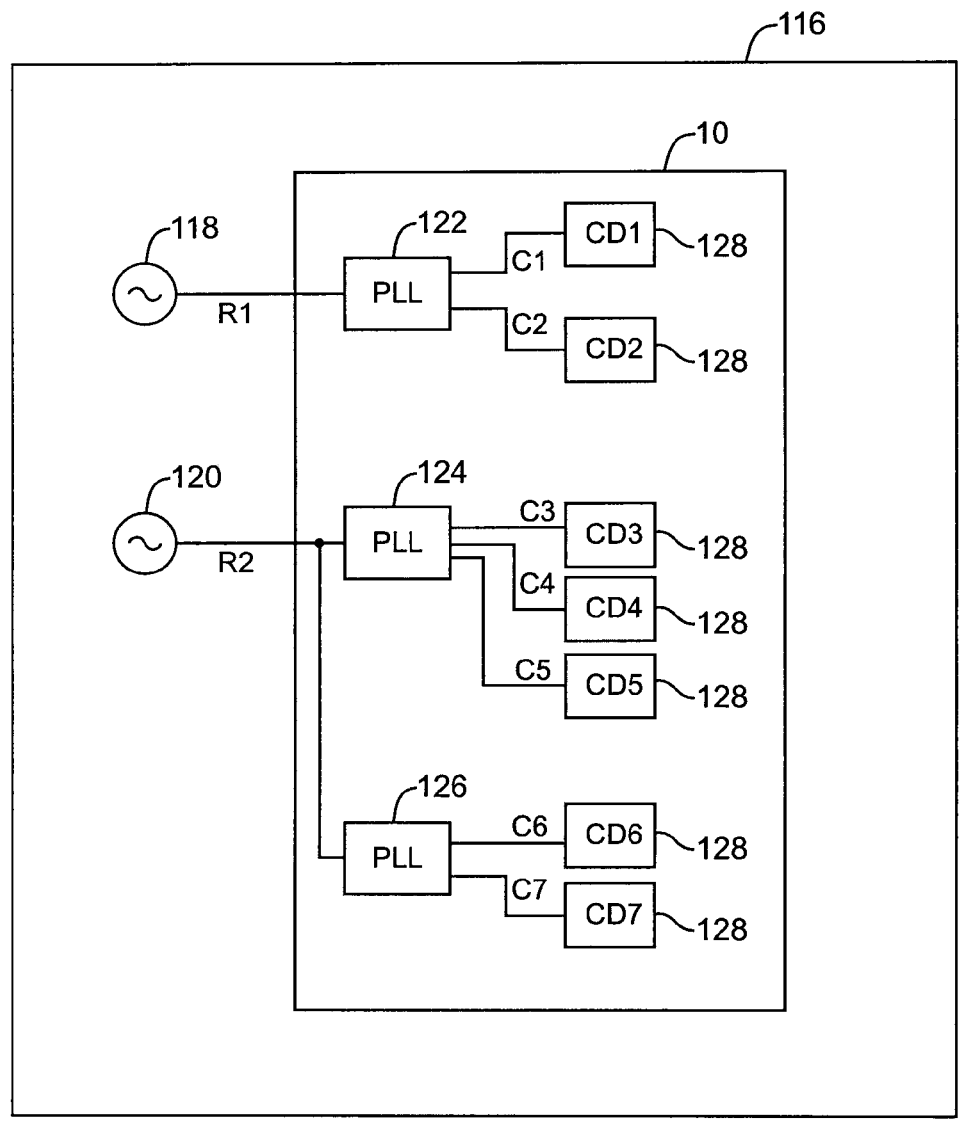
FIG. 9 is a diagram of an illustrative integrated circuit in which blocks of circuitry are associated with multiple clock domains in accordance with an embodiment of the present invention.

An illustrative programmable logic device integrated circuit that contains circuitry in multiple clock domains is shown in FIG. 9. In the example of FIG. 9, device 10 has been mounted on a circuit board 116. Clock sources 118 and 120 provide reference clock signals R1 and R2. Clock sources 118 and 120 may be crystal oscillators, other integrated circuits, or any other suitable sources of clock signals. Reference clock R1 is received by phase-locked loop circuit 122. Circuit 122 produces corresponding clocks C1 and C2 for circuitry in clock domains CD1 and CD2, respectively. Reference clock R2 is received by phase-locked loop circuits 124 and 126. Circuit 124 uses reference clock R2 to produce corresponding clocks C3, C4, and C5, which are received by circuitry in respective clock domains CD3, CD4, and CD5. Circuit 126 uses reference clock R2 to produce clock signals C6 and C7. Clock C6 is supplied to circuitry associated with clock domain CD6. Clock C7 is supplied to circuitry associated with clock domain CD7.

During the process of implementing a desired logic design in a given programmable logic device, CAD tools 62 determine which clock domains on circuit 10 are synchronous. Because clock domains CD1 and CD2 are clocked using clock signals derived from a common clock source 118, clock domains CD1 and CD2 are synchronous. Similarly, clock domains CD3-CD7 are synchronous because they share a common clock source 120. There is no synchronous relationship between CD1 or CD2 and any of the other clock domains (CD3-CD7) in the example of FIG. 9, because the circuitry of clock domains CD3-CD7 is clocked using clocks that are derived from a clock source (clock source 120) that is independent from clock source 118.

Because clock domains such as clock domain CD1 and CD6 (as an example) have clocks that are derived from separate sources, it is not possible to reduce power supply simultaneous switching noise by adjusting the phase between clocks C1 and C6. Any phase relationship that is established between these clocks would tend to change as a function of time, as clocks R1 and R2 drift with respect to each other. However, synchronous clock domains such as clock domains CD3-CD7 may have their phases adjusted to reduce power supply simultaneous switching noise, if permitted by design constraints.

Figure 10:
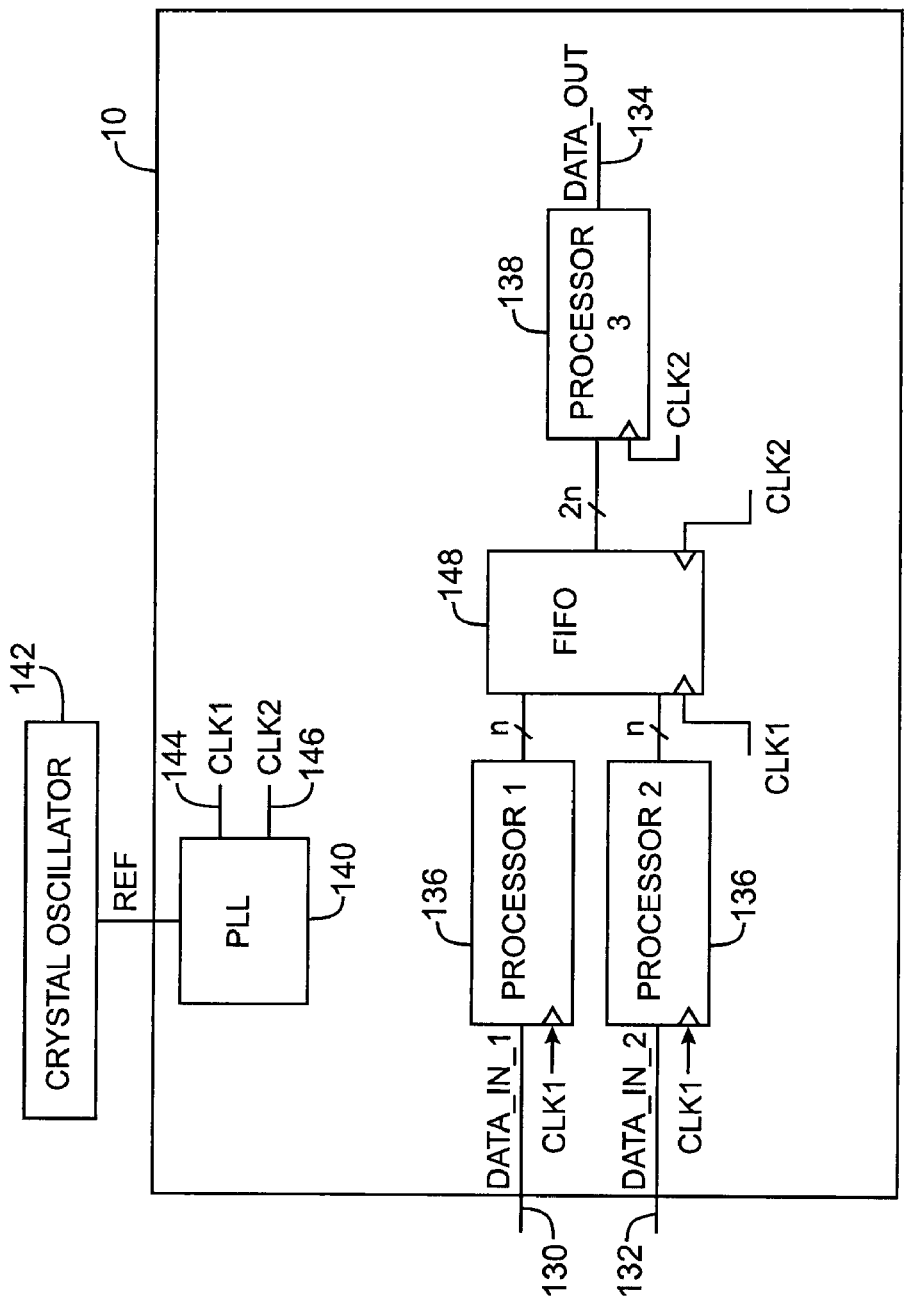
FIG. 10 is a diagram of an illustrative programmable logic device integrated circuit having circuitry in multiple clock domains in accordance with an embodiment of the present invention.

An illustrative device 10 that includes circuitry in which power supply simultaneous switching noise may be reduced by clock phase adjustments is shown in FIG. 10. In the example of FIG. 10, a crystal oscillator 142 produces a reference clock REF. Phase-locked loop circuit 140 (or other suitable circuitry such as a delay-locked-loop, etc.) receives the REF clock and produces two corresponding clock signals CLK1 and CLK2 at outputs 144 and 146, respectively. The reference clock may be (as an example), a 100 MHz clock. Clocks CLK1 and CLK2 might be 200 MHz clocks.

DATA is received at inputs 130 and 132 and, following processing, is provided at data output 134. Processing blocks 136 are associated with a first clock domain and are clocked with clock signal CLK1. Processing block 138 is associated with a second clock domain and is clocked with clock signal CLK2. A first-in-first-out (FIFO) circuit 148 serves as an interface between processing blocks 136 and processing block 138. Because of the presence of FIFO circuit 148, there is no requirement for a fixed phase relationship between clock CLK1 and CLK2. Any suitable phase relationship may be used. Regardless of the phase between CLK1 and CLK2, the desired circuit functionality will be preserved.

To reduce power supply simultaneous switching noise, CAD tools 62 exploit the adjustability of the phase between CLK1 and CLK2. By altering the phase between these clocks, overlapping rising clock edges can be reduced or eliminated.

Clock phase adjustments may be made using any suitable clock adjustment circuitry. For example, clock phase adjustments may be made using circuitry that is based on delay-locked loops, delay lines, delay chains, or other such circuitry. With one suitable arrangement, which is described herein as an example, clock adjustment circuitry is used that is based on programmable phase-locked loop circuitry. Programmable phase-locked loop circuitry on device 10 may have clock phase adjustment capabilities. In this type of scenario, clock phase adjustments may be made by programming the phase-locked loop with appropriate configuration data. CAD tools 62 can generate the configuration data for programming the programmable phase-locked loop circuitry when implementing a desired logic design in a given programmable logic device.

Figure 11:
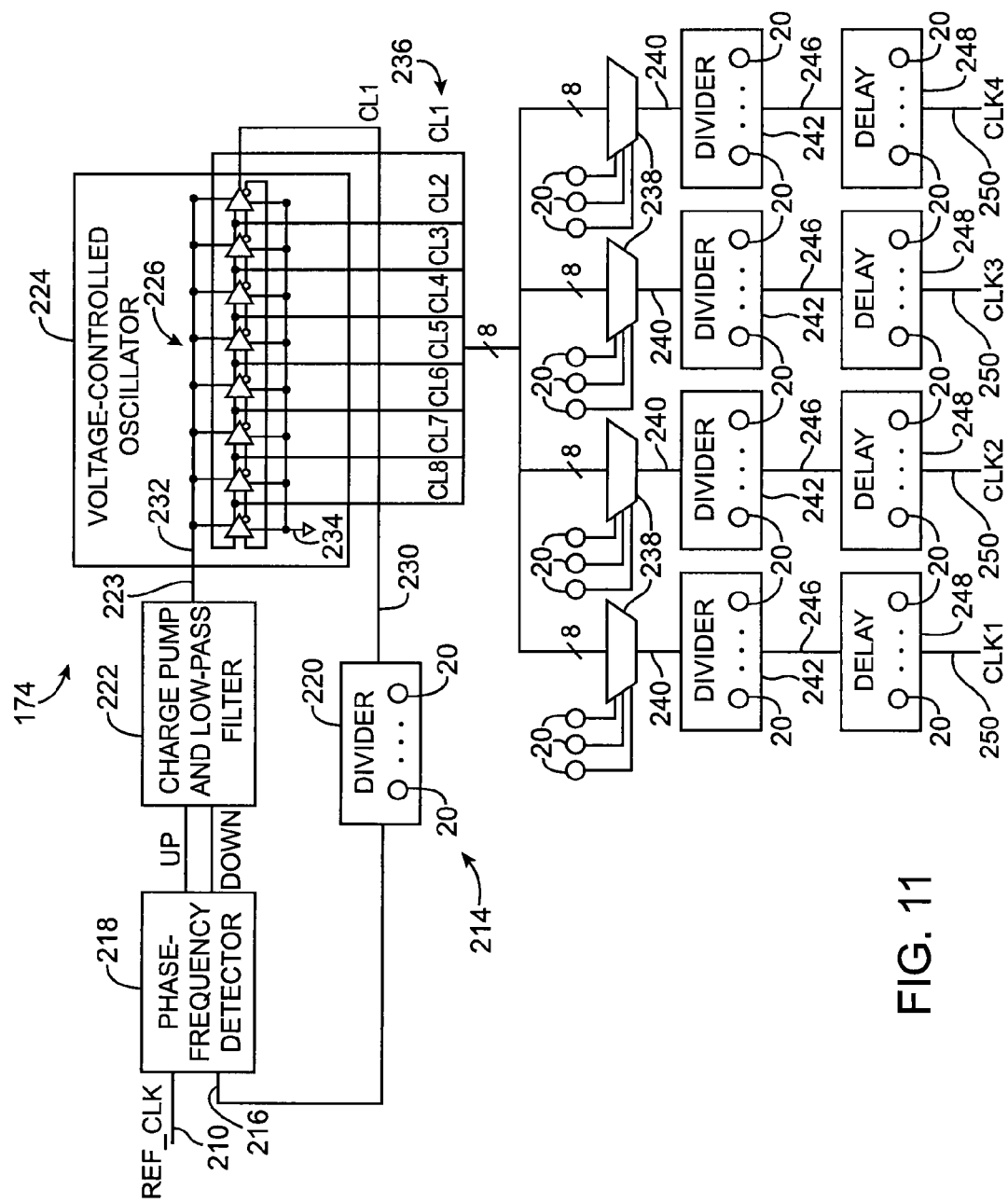
FIG. 11 is a diagram of illustrative clock phase adjustment circuitry in accordance with the an embodiment of the present invention.

Illustrative programmable phase-locked loop circuitry 174 is shown in FIG. 11. As shown in FIG. 11, phase-locked-loop circuit 174 has a phase-frequency detector 218 that receives a reference clock signal REF_CLK at input 210. The phase-frequency detector 218 also receives a feedback signal from feedback path 214 at input 216. The phase-frequency detector 218 compares the signals on lines 210 and 216 and generates a corresponding error control signal for charge pump and low pass filter 222. If desired, the error control signal may be provided in the form of separate UP and DOWN signals on respective control lines. The error signal directs the charge pump circuitry 222 to generate a higher or lower voltage on its output line 223, as needed to lock the frequency of circuit 174 to its input.

Voltage-controlled oscillator 224 contains a ring of buffers 226. The buffers are powered using a positive power supply rail 232 that is connected to the output 223 of the charge pump 222 and a ground power supply rail 234. The frequency of the output of voltage controlled oscillator 224 is controlled by adjusting the voltage level on line 232.

The voltage-controlled oscillator 224 produces clock signals CL1-CL8 on outputs 236. Path 230 is used to feed back signal CL1 from the voltage-controlled oscillator to divider 220. Divider 220 divides the signal CL1 by an appropriate integer (e.g., by two). Divider 220 preferably contains programmable elements 20, so that the integer setting of the divider can be adjusted during device programming.

The amount by which divider 220 divides clock signal CL1 determines the ratio between the frequency of REF_CLK and clock signal CL1. The frequencies of clocks CL1-CL8 are the same, but because each clock CL1-CL8 is obtained by tapping into the oscillating loop in voltage controlled oscillator 224 at a different tap point, each of clocks CL1-CL8 is shifted in phase by 45° with respect to the other. For example, clock CL2 is shifted 45° in phase with respect to clock CL1, clock CL3 is shifted 45° in phase with respect to clock CL2, etc. The clock phases on lines 236 are provided in parallel to the inputs of programmable multiplexers 238. Each programmable multiplexer (in this example) has eight inputs and a single output. Control signals from associated programmable elements 20 are used to select which of the inputs for each multiplexer is connected to its output. By adjusting each multiplexer 238, a desired clock phase may be chosen for a respective output line 240.

Programmable dividers 242 divide the signals on lines 240 by integer values. Each divider 220 preferably contains programmable elements 20 that can be adjusted during device programming to control the integer setting for that divider. The divided output signals from dividers 242 are supplied on output lines 246. Each output signal is delayed by a respective delay circuit 248. The settings of the delay circuits 248 can be adjusted by loading appropriate configuration data into their programmable elements. The amount of delay can be configured from zero to a desired maximum delay amount. The number of adjustable steps for each delay circuit 248 is related to the number of programmable elements 20 that are associated with that delay circuit.

After clock phase selection using multiplexers 238, clock frequency selection by dividers 242, and additional clock phase adjustment using delay circuits 248, clock signals CLK1, CLK2, CLK3, and CLK4 are provided on clock output lines 250. Each of the clock signals on lines 250 may be provided to a different block of circuitry on device 10 and can be associated with a respective clock domain. There are four clock signals CLK1, CLK2, CLK3, and CLK4 in the example of FIG. 11. This is merely illustrative. Any suitable number of adjustable clock signals can be produced by phase-locked loop circuitry such as phase-locked loop 174 if desired.

Figure 12:
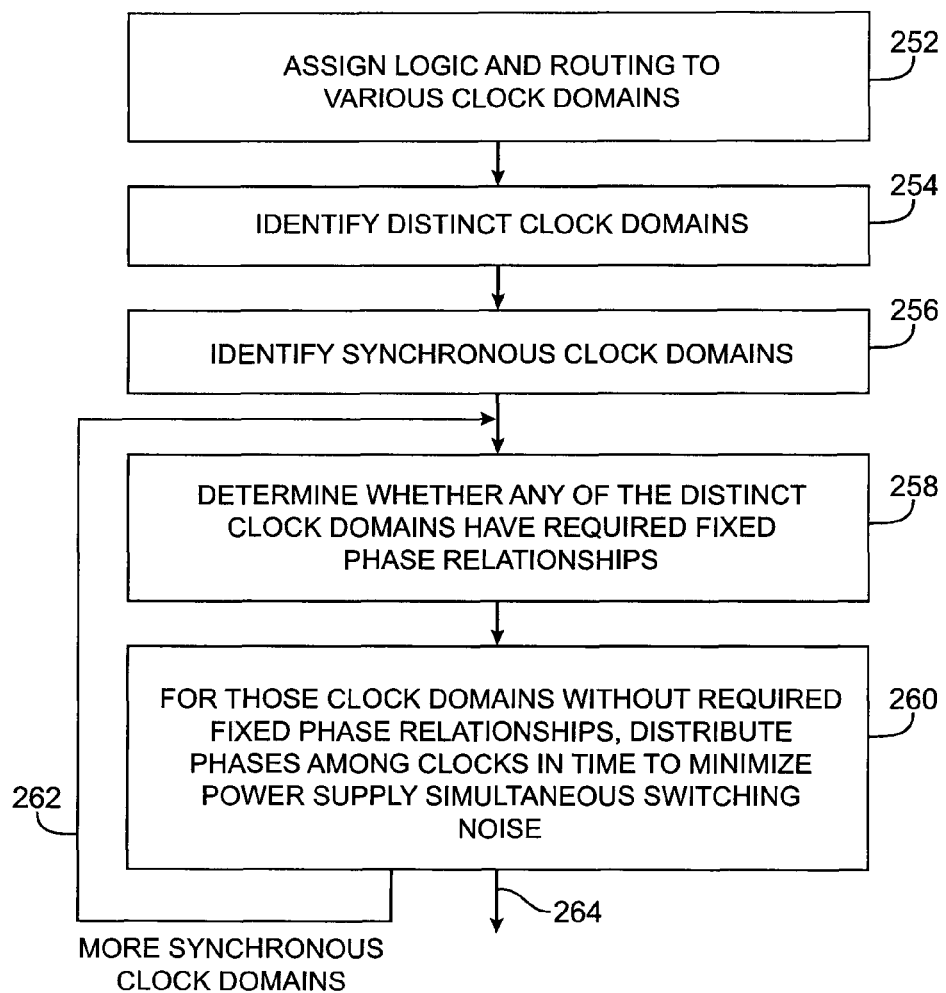
FIG. 12 is a flow chart of illustrative steps involved in minimizing power supply simultaneous switching noise in accordance with the present invention.

Illustrative steps involved in using CAD tools 62 to minimize power supply simultaneous switching noise when implementing a desired logic design in a programmable logic device are shown in FIG. 12. The operations of FIG. 12 may be performed by clock settings module 77 and other placement and routing tools 76 (FIG. 4) during the operations of 86 (FIG. 5) or may be performed by other CAD tools 62 when implementing a design in a programmable logic device.

A logic designer supplies a custom logic design to CAD tools 62, which CAD tools 62 process using synthesis tools 74. At step 252, during place and route operations, CAD tools 62 make logic and routing assignments for the custom circuit design. During this process, blocks of programmable logic 18 are placed at suitable locations on a device 10 and routing resources are allocated to convey signals between blocks of hardwired and programmable logic. As described in connection with FIG. 9, the blocks of logic that are used in implementing a given design are associated with different clock domains.

At step 254, CAD tools 62 analyze the circuitry of the custom logic design for device 10 to identify which clock domains are present in the design. For example, in the arrangement of FIG. 9, CAD tools 62 would identify CD1, CD2, CD3, CD4, CD5, CD6, and CD7 as being distinct clock domains.

At step 256, CAD tools 62 determine which of the distinct clock domains are synchronous. For example, when processing circuitry of the type shown in FIG. 9, tools 62 would determine that clock domains CD1 and CD2 are synchronous with each other and would determine that clock domains CD3, CD4, CD5, CD6, and CD7 are synchronous with each other. It is possible to reduce power supply simultaneous switching noise by adjusting clock phases for the clock domains within each group of circuit blocks that are associated with synchronous clock domains (i.e., by adjusting the clock phases of C1 and C2 of FIG. 9 in relation to each other), but not by adjusting the clocks of domains that are not in the same synchronous group (i.e., not by adjusting the phase of clock C1 relative to clock C3 in the FIG. 9 example).

After organizing the clock domains into synchronous groups at step 256, tools 62 process each group of synchronous clock domains that has been identified. As shown in FIG. 12, the groups of synchronous clock domains may, if desired, be processed one at a time in a loop.

At step 258, tools 62 determine whether any of the distinct clock domains in a given synchronous group of clock domains have required fixed phase relationships. For example, when examining synchronous clock domains CD3, CD4, CD5, CD6, and CD7, tools 62 might determine that the phase relationship between clock domains CD4 and CD5 must remain fixed at a particular value (e.g., there may be a required 0° phase shift between the rising clock edges of clocks C4 and C5 or a required fixed 90° phase relationship, etc.). The phases of clocks with required fixed phase relationships cannot be adjusted to reduce power supply simultaneous switching noise. The clocks associated with clock domains that do not have required fixed phase relationships can be adjusted in phase to lower power supply simultaneous switching noise, as described in connection with FIGS. 7 and 8.

At step 260, for at least some of those clock domains having clocks without required fixed phase relationships, CAD tools 62 make clock phase adjustments to distribute the phases of their clocks in time. Distributing the clock signal phases in this way minimizes power supply simultaneous switching noise. For example, as described in connection with FIGS. 7 and 8, if there are two clocks that are initially in phase so that the rising edges of their clocks are synchronized as shown in FIG. 7, the phase of one or both of the clocks can be adjusted so that the resulting situation is as shown in FIG. 8, with the two clocks 180° out of phase. When the clocks are adjusted in this way, the rising edges of the clocks are not aligned, which reduces the current peaks on the power supply rails and therefore reduces power supply simultaneous switching noise. It is not necessary to distribute the clocks so that they are 180° out of phase. For example, in situations with three clocks, the clocks can be distributed in time so they are each 120° out of phase. When there are four clocks, it may be desirable to distribute the clock phases in time so that each clock is 90° out of phase with respect to the next, etc.

During the operations of step 260, CAD tools 62 determine appropriate settings for programmable phase-locked loop circuit 174 (FIG. 11) or other suitable clock adjustment circuitry (e.g., clock adjustment circuitry based on a delay-locked loop, delay-line-based clock adjustment circuitry, clock adjustment circuitry formed from delay chains or other such circuits, etc.). For example, CAD tools 62 may determine appropriate settings for multiplexers 238, dividers 242, and delay circuits 248. The settings that are chosen for programmable phase-locked loop circuit 174 or other suitable clock phase adjustment circuitry allow the clock phases to be changed as needed to minimize power supply simultaneous switching noise. The settings are provided to device 10 in the form of configuration data during device programming, so that the custom logic design is implemented in a programmable logic device integrated circuit with reduced power supply simultaneous switching noise.

As indicated by line 262, if there are additional groups of synchronous clock domains to be configured, processing loops back to step 258. If all clock domains on device 10 have been processed, CAD tools 62 can perform additional tasks (e.g., assembly process 92 of FIG. 5), as indicated by line 264.

The foregoing is merely illustrative of the principles of this invention and various modifications can be made by those skilled in the art without departing from the scope and spirit of the invention.

What is claimed is:

1. A computer-implemented method for using a computer-aided design tool to minimize power supply simultaneous switching noise when implementing a custom circuit design in a programmable logic device integrated circuit, comprising:

identifying distinct clock domains in the custom circuit design, wherein each clock domain has an associated clock;

identifying which of the distinct clock domains are synchronous; and for at least some of the identified synchronous clock domains, making by a computer clock phase adjustments to their associated clocks to minimize power supply simultaneous switching noise on the programmable logic device integrated circuit.

2. The method defined in claim 1 further comprising determining which of the synchronous clock domains have required fixed phase relationships, wherein making the clock phase adjustments comprises making clock phase adjustments to clocks associated with those synchronous clock domains without required fixed phase relationships.

3. The method defined in claim 1 wherein making the clock phase adjustments comprises adjusting a programmable phase-locked loop circuit.

4. The method defined in claim 1 wherein making the clock phase adjustments comprises distributing clock phases for the clocks in time to minimize power supply simultaneous switching noise.

5. The method defined in claim 1 wherein the identified synchronous clock domains include a first clock domain having a first clock and a second clock domain having a second clock with rising clock edges that are aligned with rising clock edges in the first clock and wherein making the clock phase adjustments comprises adjusting the phase of the second clock by 180° so that the first clock and second clock are 180° out of phase.

6. The method defined in claim 1 wherein the programmable logic device comprises a clock phase adjustment circuit that produces a plurality of different clock phases and that has a plurality of multiplexers each of which receives the plurality of the different clock phases and provides a selected one of the clock phases to a respective output and wherein making the clock phase adjustments comprises generating settings for at least one of the programmable multiplexers.

7. The method defined in claim 1 wherein the programmable logic device comprises programmable circuitry that produces a plurality of different clock phases and that has a plurality of programmable delay circuits each of which provides delay to a respective one of the clock phases and wherein making the clock phase adjustments comprises generating settings for at least one of the programmable delay circuits.

8. The method defined in claim 1 wherein the programmable logic device comprises a programmable phase-locked loop having a voltage-controlled oscillator that produces a plurality of different clock phases, having a plurality of multiplexers each of which receives the plurality of the different clock phases and provides a selected one of the clock phases to a respective output, and having a plurality of programmable delay circuits each of which receives one of the selected clock phases from one of the respective outputs and wherein making the clock phase adjustments comprises generating settings for at least one of the programmable multiplexers and at least one of the programmable delay circuits.

9. The method defined in claim 1 wherein identifying which of the distinct clock domains are synchronous comprises identifying at least two groups of synchronous clock domains and wherein making the clock phase adjustments to the clocks to minimize power supply simultaneous switching noise comprises making clock phase adjustments to clocks associated with the two groups of synchronous clock domains.

10. The method defined in claim 1 wherein making the clock phase adjustments comprises adjusting at least one multiplexer in a programmable phase-locked loop circuit.

11. Computer-readable storage media, embedded thereon software, when executed by a computer, causes the computer to implement a method to minimize power supply simultaneous switching noise when implementing a custom circuit design in a programmable logic device integrated circuit, the software comprising:

code for identifying distinct clock domains in a custom circuit design for a programmable logic device, wherein each clock domain has an associated clock;

code for identifying which of the distinct clock domains are synchronous; and code for making clock phase adjustments to the clocks associated with at least some of the identified synchronous clock domains to minimize power supply simultaneous switching noise on the programmable logic device.

12. The computer-readable storage media defined in claim 11 further comprising code for determining which of the synchronous clock domains have required fixed phase relationships, wherein the code for making the clock phase adjustments comprises code for making clock phase adjustments to the clocks associated with those synchronous clock domains without required fixed phase relationships.

13. The computer-readable storage media defined in claim 11 wherein the code for making the clock phase adjustments comprises code for adjusting a programmable phase-locked loop circuit on the programmable logic device.

14. The computer-readable storage media defined in claim 11 wherein the code for making the clock phase adjustments comprises code for distributing clock phases for the clocks in time to minimize power supply simultaneous switching noise.

15. The computer-readable storage media defined in claim 11 wherein the identified synchronous clock domains include a first clock domain having a first clock and a second clock domain having a second clock with rising clock edges that are aligned with rising clock edges in the first clock and wherein the code for making the clock phase adjustments comprises code for adjusting the phase of the second clock by 180° so that the first clock and second clock are 180° out of phase.

16. The computer-readable storage media defined in claim 11 wherein the programmable logic device comprises a clock phase adjustment circuit that produces a plurality of different clock phases and has a plurality of multiplexers each of which receives the plurality of the different clock phases and provides a selected one of the clock phases to a respective output and wherein the code for making the clock phase adjustments comprises code for generating settings for at least one of the programmable multiplexers.

17. The computer-readable storage media defined in claim 11 wherein the programmable logic device comprises programmable circuitry that produces a plurality of different clock phases and that has a plurality of programmable delay circuits each of which provides delay to a respective one of the clock phases and wherein the code for making the clock phase adjustments comprises code for generating settings for at least one of the programmable delay circuits.

18. The computer-readable storage media defined in claim 11 wherein the programmable logic device comprises a programmable phase-locked loop having a voltage-controlled oscillator that produces a plurality of different clock phases, having a plurality of multiplexers each of which receives the plurality of the different clock phases and provides a selected one of the clock phases to a respective output, and having a plurality of programmable delay circuits each of which receives one of the selected clock phases from one of the respective outputs and wherein the code for making the clock phase adjustments comprises code for generating settings for at least one of the programmable multiplexers and at least one of the programmable delay circuits.

19. The computer-readable storage media defined in claim 11 wherein identifying which of the distinct clock domains are synchronous comprises identifying at least two groups of synchronous clock domains and wherein the code for making the clock phase adjustments to the clocks to minimize power supply simultaneous switching noise comprises code for making clock phase adjustments to clocks associated with the two groups of synchronous clock domains.

20. The computer-readable storage media defined in claim 11 wherein the code for making the clock phase adjustments comprises code for adjusting at least one multiplexer in a programmable phase-locked loop circuit on the programmable logic device.

* * * * *